US009743214B2

(12) United States Patent
Kumagai et al.

(10) Patent No.: US 9,743,214 B2
(45) Date of Patent: Aug. 22, 2017

(54) SOUND PROCESSING APPARATUS AND PARAMETER SETTING METHOD

(75) Inventors: Kunihiro Kumagai, Hamamatsu (JP); Masaya Kano, Hamamatsu (JP)

(73) Assignee: YAMAHA CORPORATION, Hamamatsu-Shi (JP)

( * ) Notice: Subject to any disclaimer, the term of this patent is extended or adjusted under 35 U.S.C. 154(b) by 974 days.

(21) Appl. No.: 13/474,878

(22) Filed: May 18, 2012

(65) Prior Publication Data

US 2012/0294460 A1 Nov. 22, 2012

(30) Foreign Application Priority Data

May 20, 2011 (JP) ................................ 2011-114165

(51) Int. Cl.

| | |
|---|---|
| ***H03G 5/00*** | (2006.01) |
| ***H04S 7/00*** | (2006.01) |
| *H04S 1/00* | (2006.01) |
| *H04R 3/04* | (2006.01) |

(52) U.S. Cl.

CPC ................ *H04S 7/307* (2013.01); *H04R 3/04* (2013.01); *H04S 1/002* (2013.01); *H04S 7/301* (2013.01); *H04S 7/305* (2013.01)

(58) Field of Classification Search

USPC ... 381/59, 97, 92, 111, 99, 98, 101, 56, 312, 381/102, 104; 700/94

See application file for complete search history.

(56) References Cited

U.S. PATENT DOCUMENTS 3,158,695 A * 11/1964 Camras ........................... 369/91
4,868,878 A * 9/1989 Kunugi et al. .................... 381/1
4,980,914 A 12/1990 Kunugi et al.
5,774,562 A * 6/1998 Furuya et al. .................. 381/66
7,333,863 B1 * 2/2008 Lydecker ............. G10H 1/0091 381/103

(Continued)

FOREIGN PATENT DOCUMENTS

EP 2 045 620 A1 4/2009
JP 55-151808 A 11/1980

(Continued)

OTHER PUBLICATIONS

Japanese Office Action dated Apr. 23, 2013 issued in corresponding Japanese Patent Application 2011-114165 English translation provided.

(Continued)

*Primary Examiner* — Davetta W Goins
*Assistant Examiner* — Kuassi Ganmavo
(74) *Attorney, Agent, or Firm* — Rossi, Kimms & McDowell LLP

(57) ABSTRACT

A sound processing apparatus includes a processing unit that is configured to acquire an audio signal, perform a correction processing on the acquired audio signal and output the correction-processed audio signal to a sound emitting unit. The correction processing includes an indirect sound adjusting processing in which a given signal processing is performed on an audio signal so as to adjust an influence of an indirect sound to be heard at a sound receiving point, and a frequency characteristic adjusting processing in which a frequency characteristic of an audio signal is adjusted. In the correction processing, a frequency characteristic for the frequency characteristic adjusting processing is determined based on a frequency characteristic of the indirect sound adjusting processing.

5 Claims, 6 Drawing Sheets

(56) References Cited

U.S. PATENT DOCUMENTS

| | | | | |
|---|---|---|---|---|
| 2006/0086237 | A1* | 4/2006 | Burwen | H04S 3/00 84/630 |
| 2006/0177074 | A1 | 8/2006 | Ko | |
| 2008/0069366 | A1 | 3/2008 | Soulodre | |
| 2008/0232603 | A1 | 9/2008 | Soulodre | |
| 2009/0319066 | A1* | 12/2009 | Tsuji et al. | 700/94 |
| 2011/0268299 | A1* | 11/2011 | Oda | 381/307 |
| 2012/0063608 | A1 | 3/2012 | Soulodre | |
| 2012/0221329 | A1* | 8/2012 | Harsch | 704/225 |
| 2012/0275613 | A1 | 11/2012 | Soulodre | |

FOREIGN PATENT DOCUMENTS

| | | | | |
|---|---|---|---|---|
| JP | 60-223294 | A | | 11/1985 |
| JP | 60223295 | A | | 11/1985 |
| JP | 63-027895 | A | * | 1/1986 |
| JP | 06 327-895 | A | * | 7/1986 |
| JP | 63-27895 | A | | 7/1986 |
| JP | 03129911 | A | * | 6/1991 |
| JP | 05-049098 | A | | 2/1993 |
| JP | 06-223294 | A | | 8/1994 |
| JP | 2010021982 | A | | 1/2010 |
| WO | 2008034221 | A1 | | 3/2008 |

OTHER PUBLICATIONS

Extended European Search Report issued in corresponding Eurpoean Patent Application No. 12003931.8 dated Oct. 30, 2014.

European Office Action issued in counterpart application No. EP12003931.8, dated Oct. 9, 2015.

* cited by examiner

SOUND PROCESSING APPARATUS AND PARAMETER SETTING METHOD

BACKGROUND OF THE INVENTION

1. Technical Field

The present invention relates to a technology of reducing an influence of indirect sound that is formed by sound which is output from a speaker and reflected on a wall of a room or the like, and then reaches a listener.

2. Background Art

The sound that is output from a speaker not only directly reaches a sound receiving point at which a listener is located but also indirectly reaches the sound receiving point after it is reflected on a wall surface of a room or the like. The indirect sound that indirectly reaches as described above is mixed with the direct sound that directly reaches, so that the listener hears sound that is different from the sound actually output from the speaker. In particular, the indirect sound, which reaches later than the direct sound by time shorter than a temporal resolution of an auditory sense, is heard as sound having different sound quality, rather than reverberant sound of the room. Hence, a technology has been developed which performs correction processing for the sound output from the speaker so as to reduce the influence of the indirect sound to be exerted on the sound quality at the sound receiving point (refer to JP-A-5-49098 and JP-A-60-223295).

SUMMARY OF THE INVENTION

While the correction processing can reduce the influence of the indirect sound that is exerted on the sound quality, it also changes a frequency characteristic of the sound that the listener hears. Therefore, the listener has an impression as if an energy feeling of the sound were changed in a frequency band in which the characteristic is largely changed depending on whether the correction processing has been performed or not. When a level is lowered in a specific frequency band, the listener feels that there is something lacking, depending on the frequency band.

The present invention has been made to solve the above problem. An object of the invention is to suppress a change in frequency characteristic of listening sound, which is caused when adjusting an influence of indirect sound to be exerted on a sound quality.

A first aspect of the present invention provides a sound processing apparatus, including: a processing unit that is configured to acquire an audio signal, to perform a correction processing on the acquired audio signal and to output the correction-processed audio signal to a sound emitting unit, the correction processing including an indirect sound adjusting processing in which a given signal processing is performed on an audio signal so as to adjust an influence of an indirect sound to be heard at a sound receiving point among a sound emitted by the sound emitting unit and the audio signal on which the given signal processing is performed is added to the acquired audio signal, and a frequency characteristic adjusting processing in which a frequency characteristic of an audio signal is adjusted, wherein a frequency characteristic for the frequency characteristic adjusting processing is determined so that a frequency characteristic of an impulse response at the sound receiving point in a case where the correction processing is performed comes closer to that in a case where the correction processing is not performed, as compared with that in a case where the indirect sound adjusting processing of the correction processing is performed.

A second aspect of the present invention provides a sound processing apparatus, including: a processing unit that is configured to acquire an audio signal, to perform a correction processing on the acquired audio signal and to output the correction-processed audio signal to a sound emitting unit, the correction processing including an indirect sound adjusting processing in which a given signal processing is performed on an audio signal so as to adjust an influence of an indirect sound to be heard at a sound receiving point among a sound emitted by the sound emitting unit and the audio signal on which the given signal processing is performed is added to the acquired audio signal, and a frequency characteristic adjusting processing in which a frequency characteristic of an audio signal is adjusted, wherein a frequency characteristic for the frequency characteristic adjusting processing is determined based on a frequency characteristic of the indirect sound adjusting processing.

The sound processing apparatus may be configured so that at least a part of the frequency characteristic for the frequency characteristic adjusting processing is set to be a reverse characteristic of the frequency characteristic of the indirect sound adjusting processing.

The sound processing apparatus may be configured so that a characteristic dip part of the frequency characteristic for the frequency characteristic adjusting processing is set to be a reverse characteristic of the frequency characteristic of the indirect sound adjusting processing.

The sound processing apparatus may be configured so that a characteristic dip part around 100 Hz of the frequency characteristic for the frequency characteristic adjusting processing is set to be a reverse characteristic of the frequency characteristic of the indirect sound adjusting processing.

The sound processing apparatus may be configured so that the given signal processing performed in the indirect sound adjusting processing is implemented using a multi-tap delay.

The sound processing apparatus may be configured so that a maximum delay time in the multi-tap delay is set to be 50 milliseconds or less.

A third aspect of the present invention provides a method for setting a parameter in a sound processing apparatus that includes a processing unit that is configured to acquire an audio signal, to perform a correction processing on the acquired audio signal and to output the correction-processed audio signal to a sound emitting unit, the correction processing including an indirect sound adjusting processing in which a given signal processing is performed on an audio signal based on a first parameter so as to adjust an influence of an indirect sound to be heard at a sound receiving point among a sound emitted by the sound emitting unit and the audio signal on which the given signal processing is performed is added to the acquired audio signal, and a frequency characteristic adjusting processing in which a frequency characteristic of an audio signal is adjusted based on a second parameter, the method including: causing the sound emitting unit to output a measuring sound and measuring an impulse response at the sound receiving point; analyzing the measured impulse response, and calculating an impulse response at the sound receiving point when an audio signal that indicates the measuring sound is input into the sound processing apparatus and a sound is output from the sound emitting unit in correspondence to cases where a plurality of different values are determined as the first parameter, respectively, thereby specifying a value of the first parameter from the plurality of different values; and specifying the second parameter based on a frequency characteristic of the indirect sound adjusting processing that is determined by the specified value of the first parameter.

According to at least one of the aspects of the present invention, it is possible to suppress a change in frequency characteristic of listening sound, which is caused when adjusting an influence of indirect sound to be exerted on a sound quality.

DETAILED DESCRIPTION OF THE EXEMPLARY EMBODIMENTS

Embodiments

[Schematic Configuration]

Figure 1:
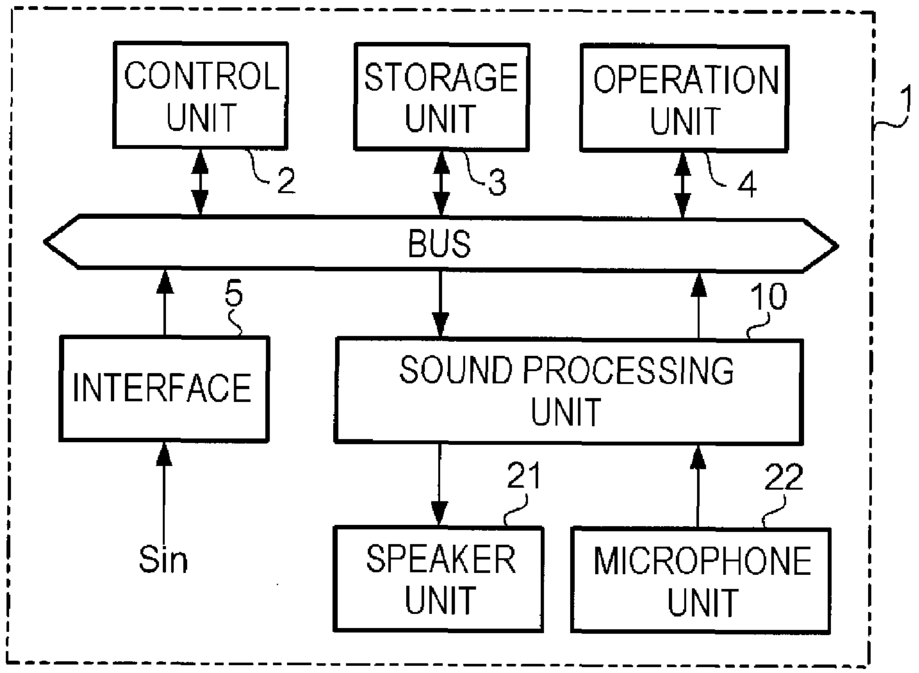
FIG. 1 is a block diagram illustrating a configuration of a speaker apparatus in an embodiment of the invention.

FIG. 1 is a block diagram illustrating a configuration of a speaker apparatus 1 in an embodiment of the invention. The speaker apparatus 1 includes a control unit 2, a storage unit 3, an operation unit 4, an interface 5 and a sound processing unit 10. The respective constitutional elements are connected via buses. Also, the sound processing unit 10 is connected with a speaker unit 21 and a microphone unit 22.

The control unit 2 has a CPU (Central Processing Unit), a RAM (Random Access Memory), a ROM (Read Only Memory) and the like. The control unit 2 executes a control program stored in the storage unit 3 or ROM, thereby controlling the respective parts of the speaker apparatus 1 via the bus. For example, the control unit 2 controls the sound processing unit 10, thereby implementing respective configurations for performing correction processing and measuring processing in the sound processing unit 10.

The correction processing is performed in the speaker apparatus 1 so as to reduce an influence of indirect sound from sound that is output from the speaker apparatus 1 and then a listener hears at a sound receiving point. The measuring processing is performed in the sound processing unit 10 when the control unit 2 performs setting processing of setting parameters that are used in the correction processing. The setting processing is performed when changing an environment such as a provision position of the speaker apparatus 1, a room in which the speaker apparatus is provided, a sound receiving position and the like, and starts as a user operates the operation unit 4.

The storage unit 3 corresponds to storage means such as non-volatile memory and stores a setting parameter and the like that are used in the control of the control unit 2. The setting parameter includes parameters that are set in a correction processing unit 102 (an indirect sound adjusting unit 1021, a frequency characteristic adjusting unit 1022), which will be described later.

The operation unit 4 has an operation means such as a volume for adjusting a volume level and an operation button for inputting an instruction to change a setting, and the operation unit 4 outputs information indicating operation contents to the control unit 2.

The interface 5 indicates an input terminal for acquiring an audio signal Sin from the outside, and the like.

Figure 2:
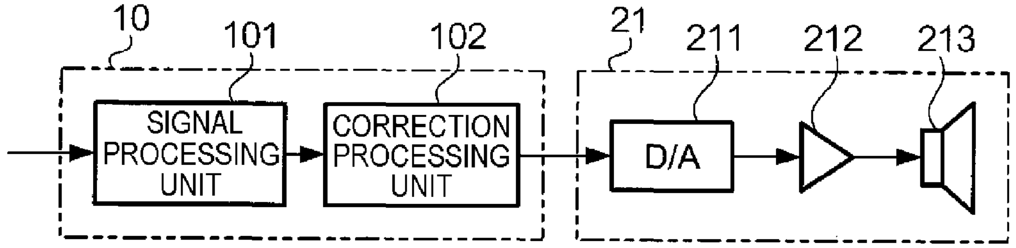
FIG. 2 is a block diagram illustrating a configuration of a sound processing unit performing correction processing in the embodiment of the invention.
Figure 4:
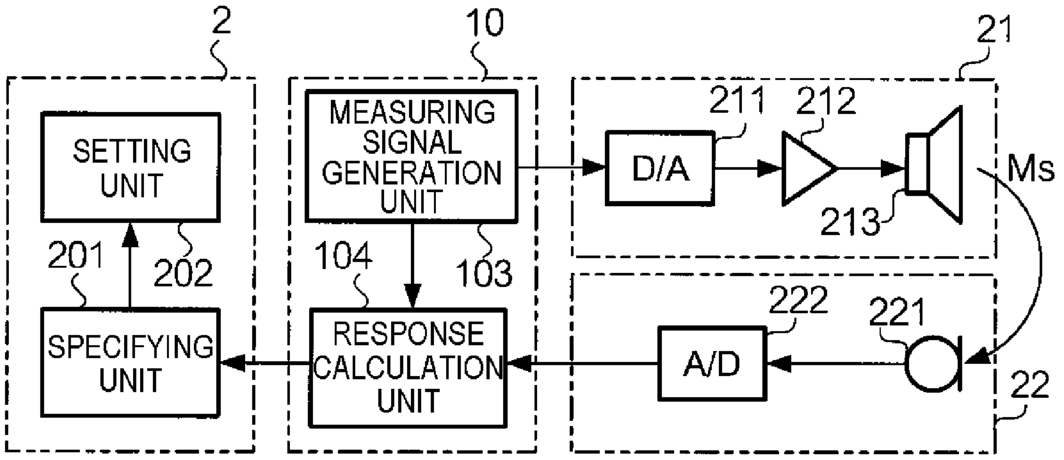
FIG. 4 is a block diagram illustrating a configuration of performing setting processing in the embodiment of the invention.

The speaker unit 21 corresponds to sound emission means that outputs an input audio signal as sound, and has a digital/analog conversion unit (D/A) 211 that converts an audio signal of the input digital signal into an analog signal, an amplification unit 212 that amplifies and outputs the input audio signal and a speaker unit 213 that outputs the input audio signal as sound (refer to FIGS. 2 and 4). The sets of the respective configurations of the speaker unit 21 are provided in correspondence to the number of channels capable of making an output. When each configuration of the speaker unit 21 is two sets, each set corresponds to an L channel and an R channel of the audio signal, for example. Also, the speaker unit 213 may be a speaker array consisting of a plurality of speaker units, other than a single speaker unit.

The microphone unit 22 has a substantially non-directional microphone 221 that outputs input sound as an audio signal and an analog/digital conversion unit (A/D) 222 that converts the audio signal of the input analog signal into a digital signal (refer to FIG. 4).

The sound processing unit 10 performs a variety of processing for the audio signal in response to the control of the control unit 2. In the below, the respective configurations of the sound processing unit 10 for performing the correction processing are described.

[Correction Processing]

FIG. 2 is a block diagram illustrating a configuration of the sound processing unit 10 for performing correction processing in the embodiment of the invention. The correction processing in the sound processing unit 10 is implemented by a signal processing unit 101 and a correction processing unit 102. The correction processing unit 102 operates, based on parameters that are set under control of the control unit 2. The parameters are set by setting processing, and the setting content thereof is stored in the storage unit 3, as described above. Also, the sound processing unit 10 may have a memory that stores the setting content.

The signal processing unit 101 acquires the audio signal Sin input to the interface 5, performs a variety of signal processing such as decode processing, equalizer processing, sound effect processing and the like for the audio signal and outputs the same. The correction processing unit 102 performs the correction processing for the audio signal output from the signal processing unit 101 and then outputs the same to the speaker unit 21.

The detailed configuration of the correction processing unit 102 is described with reference to FIG. 3.

[Configuration of Correction Processing Unit 102]

Figure 3:
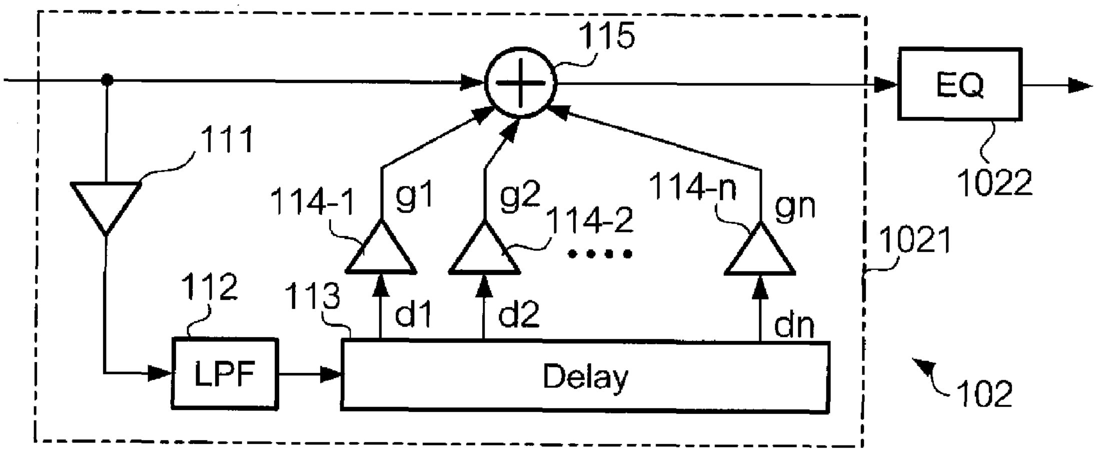
FIG. 3 is a block diagram illustrating a configuration of a correction processing unit in the embodiment of the invention.

FIG. 3 is a block diagram illustrating a configuration of the correction processing unit 102 in the embodiment of the invention. The correction processing unit 102 has an indirect sound adjusting unit 1021 that performs indirect sound adjusting processing for the audio signal and a frequency characteristic adjusting unit (EQ) 1022 that performs frequency characteristic adjusting processing for the audio signal. In this example, an output signal from the indirect sound adjusting unit 1021 is input to the frequency characteristic adjusting unit 1022. Alternatively, since the indirect sound adjusting processing and the frequency characteristic adjusting processing are linear processing, respectively, a structure may be also possible in which an output signal from the frequency characteristic adjusting unit 1022 is input to the indirect sound adjusting unit 1021. That is, the processing in the indirect sound adjusting unit 1021 and the frequency characteristic adjusting unit 1022 is preferably performed in a cascade manner for the audio signal input to the correction processing unit 102.

The indirect sound adjusting unit 1021 performs the processing for the input audio signal with a low-pass filter (LPF) and a multi-tap delay having a plurality of delay processing units, adds the processed audio signal to the original audio signal and outputs the same. The series of processing is referred to as indirect sound adjusting processing. The indirect sound adjusting unit 1021 includes an input level adjusting unit 111, a low-pass filter 112, a delay unit 113 having a plurality of taps, level adjusting units 114-1, 114-2, . . . , **114-*n* and an adding unit 115. The multi-tap delay is configured by the delay unit 113 and the level adjusting units 114-1, 114-2, . . . , 114-*n***.

The input level adjusting unit 111 adjusts an input level by amplifying the audio signal, which is input to the low-pass filter 112 and a signal line of the multi-tap delay, with an amplification factor corresponding to the control of the control unit 2. Meanwhile, such configuration may not be provided.

The low-pass filter 112 has a cutoff frequency Fc set therein and attenuates a component of a frequency band higher than the cutoff frequency Fc from the audio signal acquired from the input level adjusting unit 111, thereby extracting and outputting the audio signal of the cutoff frequency Fc or lower. In this example, the cutoff frequency Fc is 500 Hz (about 70 cm in terms of wavelength). Also, the cutoff frequency Fc is set as a frequency so that a wavelength thereof becomes a length several times longer than a size of a person's head, and about 1 kHz or lower is preferable. A user may designate the setting value by operating the operation unit 4.

The delay unit 113 has a plurality of delay circuits that performs the delay processing for the audio signal input from the low-pass filter 112 and n signal lines (here, n=12, for example) that are connected to taps to which the signals delay processed by the respective delay circuits are output. In the delay unit 113, delay times (d1, d2, . . . , dn) are set by the control of the control unit 2, in correspondence to the respective signal lines (taps). The delay time is set to be time of 50 milliseconds or shorter corresponding to a temporal resolution of an auditory sense. The delay unit 113 performs the delay processing of the delay time set in correspondence to the respective signal lines for the input audio signal and then outputs the same from the respective signal lines.

The level adjusting units 114-1, 114-2, . . . , **114-*n* are provided in correspondence to respective signal output lines from the delay unit 113. Amplification factors (g1, g2, . . . , gn) are set for the level adjusting units 114-1, 114-2, . . . , 114-*n* in response to the control of the control unit 2. The level adjusting units 114-1, 114-2, . . . , 114-*n* amplify and output the audio signals, which are output to the respective signal output lines, with the amplification factors that are respectively set. The outputs of the respective signal lines from the level adjusting units 114-1, 114-2, . . . , 114-*n* correspond to the outputs from the respective delay processing units in the multi-tap delay. That is, each of the delay processing units included in the multi-tap delay has a delay circuit that performs the delay processing for the signal output from the delay unit 113 to one signal line and one level adjusting unit that performs amplifying processing for the signal output to the signal line. The respective parameters (delay time in the delay unit 113, amplification factors in the level adjusting units 114-1, 114-2, . . . , 114-*n***) set in the multi-tap delay are hereinafter referred to as first parameter.

The adding unit 115 adds the audio signals, which are output from the level adjusting units 114-1, 114-2, . . . , **114-*n*, to the original audio signal (audio signal for which the signal processing has not been performed by the signal line of the delay unit 113) input to the indirect sound adjusting unit 1021** and then outputs the same.

The frequency characteristic adjusting unit 1022 is a parametric equalizer that uses an IIR (Infinite impulse response) filter, an FIR (Finite impulse response) filter and the like, and adjusts and outputs the frequency characteristic of the input audio signal, based on parameters set by the control of the control unit 2 (for example, the frequency characteristic that is determined by a central frequency, a bandwidth, a gain value and the like, which is hereinafter referred to as a second parameter). This processing is referred to as frequency characteristic adjusting processing.

The correction processing unit 102 is configured as described above. In the below, the setting processing is described.

[Setting Processing]

FIG. 4 is a block diagram illustrating a configuration of performing the setting processing in the embodiment of the invention. The setting processing is implemented by a specifying unit 201, a setting unit 202, a measuring signal generation unit 103 and a response calculation unit 104. The measuring processing that is performed in the sound processing unit 10 is implemented by the measuring signal generation unit 103 and the response calculation unit 104. Also, the specifying unit 201 and the setting unit 202 are configured by the control unit 2.

When performing the setting processing, the speaker unit 213 of the speaker apparatus 1 that is provided in the room is provided at the same position as a case where a listener actually hears. When each configuration of the speaker unit 21 is a plurality of sets, the setting processing is performed in correspondence to each of the sets. In the below, a case where the speaker unit 21 has one set is exemplified.

The microphone 221 is provided at the sound receiving position that is a listener position.

The measuring signal generation unit 103 generates a measuring signal in response to the control of the control unit 2 and outputs the same to the speaker unit 21. The measuring signal is a signal that indicates impulse sound, for example. Thereby, the speaker unit 21 outputs measuring sound Ms that indicates the measuring signal (measuring sound output processing). Also, the microphone 221 is input with sound in which the indirect sound and the like in the room are included in the measuring sound Ms, and the microphone unit 22 outputs a measuring result signal that indicates a content of the sound input to the microphone 221.

The response calculation unit 104 compares the measuring result signal, which is output from the microphone unit 22, and the measuring signal, which is generated from the measuring signal generation unit 103, calculates an impulse response and measures the same as an impulse response (hereinafter, referred to as measured impulse response) at the sound receiving point (impulse response measuring processing). Here, when the measuring signal is impulse sound, the measuring result signal becomes a signal that indicates the measured impulse response.

When the specifying unit 201 analyzes the signal that indicates the measured impulse response, performs the correction processing for a measuring signal indicating the measuring sound Ms in the correction processing 102, then outputs the same to the speaker unit 21 and outputs the same from the speaker unit 213 as sound, the specifying unit 201 calculates a response (hereinafter, referred to as an estimated impulse response) that is estimated as the impulse response at the sound receiving point (impulse response analysis processing). At this time, the specifying unit 201 calculates the estimated impulse response with respect to a case where the correction processing is performed by changing the first parameter (delay time, amplification factor), which is set in the multi-tap delay (delay unit 113 and level adjusting units 114-1, 114-2, . . . , **114-*n***), in several ways.

The input level adjusting unit 111 is fixed with an amplification factor that is determined in advance, and is set by the control unit 2. Also, the frequency characteristic adjusting unit 1022 is fixed with a second parameter that is determined in advance, and is set by the control unit 2. In this case, the second parameter is set to be a value in which the frequency characteristic adjusting processing is not performed, i.e., the frequency characteristic as the equalizer is flat.

Subsequently, the specifying unit 201 compares the signals indicating a plurality of estimated impulse responses that are calculated in correspondence to cases where a plurality of different values are determined as the first parameter, respectively. Then, as a result of the comparison, the specifying unit 201 specifies a value of the signal having energy that becomes smaller from the plurality of values, as the first parameter (first parameter specifying processing).

When the specifying unit 201 has specified the first parameter, the specifying unit 201 specifies the second parameter, based on the frequency characteristic of the indirect sound adjusting processing when the first parameter is set in the indirect sound adjusting unit 1021 (second parameter specifying processing). At this time, the second parameter is specified so that it becomes a reverse characteristic of the frequency characteristic of the indirect sound adjusting processing.

The first parameter specifying processing and the second parameter specifying processing in the specifying unit 201 will be specifically described in the corresponding processing.

The setting unit 202 acquires the first parameter and the second parameter specified in the specifying unit 201, sets the first parameter in the delay unit 113 and the level adjusting units 114-1, 114-2, . . . , **114-*n* of the indirect sound adjusting unit 1021, and sets the second parameter in the frequency characteristic adjusting unit 1022** (parameter setting processing).

In the below, a parameter setting method in the setting processing is described with reference to FIGS. 5, 6A and 6B.

[Parameter Setting Method]

Figure 5:
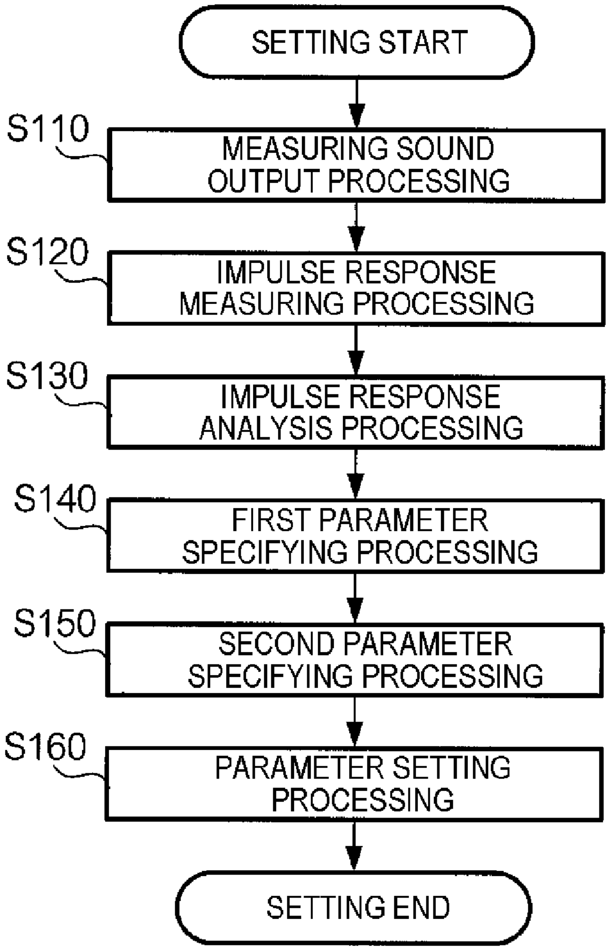
FIG. 5 is a flowchart illustrating a parameter setting method in the embodiment of the invention.

FIG. 5 is a flowchart illustrating a parameter setting method in the embodiment of the invention. When a user operates the operation unit 4 and thus inputs an instruction to start the setting processing, the speaker apparatus 1 starts the parameter setting processing.

First, when the parameter setting processing starts, the measuring signal generation unit 103 outputs a measuring signal in response to the control of the control unit 2 and outputs a measuring sound Ms from the speaker unit 213 (measuring sound output processing, step S110). Then, the response calculation unit 104 compares the measuring result signal with the measuring signal and then calculates a measured impulse response at the sound receiving point (impulse response measuring processing, step S120). Subsequently, the specifying unit 201 analyzes the measured impulse response (impulse response analysis processing, step S130), calculates a plurality of estimated impulse responses and specifies the first parameter (delay time, amplification factor), based on the signal energy of the estimated impulse responses (first parameter specifying processing, step S140). In the below, the impulse response analysis processing (step S130) and the first parameter specifying processing (step S140) are described with reference to FIGS. 6A and 6B.

Figure 6A:
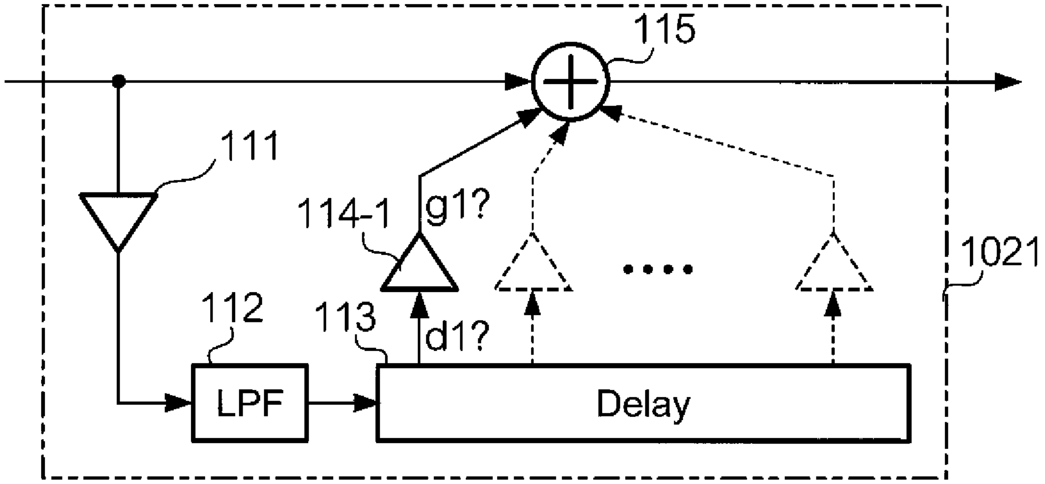
FIGS. 6A and 6B illustrate an example of impulse response analysis processing in the embodiment of the invention.
Figure 6B:
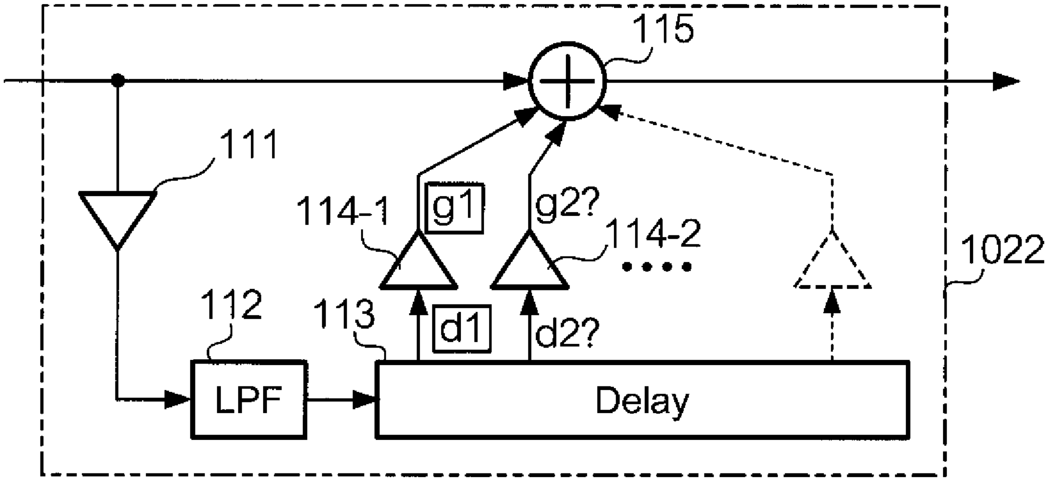

FIGS. 6A and 6B illustrate an example of the impulse response analysis processing in the embodiment of the invention. First, as shown in FIG. 6A, the specifying unit 201 activates the delay unit 113 and only the first signal line and inactivates the other signal lines among the level adjusting units 114-1, 114-2, . . . , **114-*n*. Here, the inactivation may mean that a signal is not output from the delay unit 113** to the corresponding signal line or that the amplification factor set in the level adjusting unit on the corresponding signal line is set to be 'zero (0).'

The specifying unit 201 performs the correction processing for the measuring signal indicating the measuring sound Ms when the delay time d1 and the amplification factor g1 are temporarily set with various values, and calculates an estimated impulse response that is estimated as an impulse response at the sound receiving point when outputting the correction-processed signal from the speaker unit 213 as sound. Here, the delay time d1 that is set as the first parameter is temporarily set to be larger than 0 millisecond and to be 50 milliseconds or shorter and a value thereof to be taken may be a sample unit or one millisecond unit. Also, the amplification factor g1 that is the other first parameter is temporarily set to be a value between −xdB and +ydB, and a value thereof to be taken may be a preset unit such as 1 dB unit. Also, the amplification factor g1 may be a value for inversion processing.

The specifying unit 201 compares the respective signals, which indicate the plurality of estimated impulse responses calculated in correspondence to the first parameter (delay time d1 and amplification factor g1) having a plurality of different values, and selects an estimated impulse response having the lowest energy in a preset evaluation time period Ta. Here, the evaluation time period Ta is a time period following the signal corresponding to the direct sound in the impulse response, and a span thereof is set to be 100 milliseconds or shorter. The span is preferably set to be about a double or smaller of the maximum value of the delay time set in the delay unit 113, but the value is not limited thereto. Also, when the span of the evaluation time period Ta is set to be long somewhat, it is also possible to reduce a component of a stationary wave included in the impulse response signal. In this case, the specifying unit 201 may specify a frequency of the stationary wave component and thus change the setting so that the cutoff frequency Fc set in the low-pass filter 112 becomes higher than the frequency of the stationary wave component.

Then, the specifying unit 201 specifies a value corresponding to the selected estimated impulse response as the first parameter (delay time d1, amplification factor g1).

Subsequently, as shown in FIG. 6B, the specifying unit 201 sets the first parameter (delay time d1, amplification factor g1) specified in correspondence to the first signal line and fixes the value. Then, the specifying unit 201 activates the first and second signal lines, performs the correction processing for the measuring signal indicating the measuring sound Ms when the delay time d2 and the amplification factor g2 are temporarily set with various values, and calculates an estimated impulse response that is estimated as an impulse response at the sound receiving point when outputting the correction-processed signal from the speaker unit 213 as sound. Also, like the first signal line, the specifying unit 201 calculates a plurality of estimated impulse responses, selects one estimated impulse response and specifies a value corresponding to the selected estimated impulse response as the first parameter (delay time d2, amplification factor g2).

The specifying unit 201 repeats the above processing. When having specified the parameter that should be set in correspondence to the nth signal line, the specifying unit 201 ends the first parameter specifying processing.

Back to FIG. 5, when the specifying unit 201 ends the first parameter specifying processing, the specifying unit 201 calculates a frequency characteristic (for example, refer to FIG. 8) of the indirect sound adjusting processing where the first parameters specified in correspondence to all the signal lines are set in the indirect sound adjusting unit 1021, and specifies a reverse characteristic of the frequency characteristic as the second parameter (frequency characteristic) (second parameter specifying processing, step S150). At this time, it is not necessarily required that the reverse characteristic of the frequency characteristic of the indirect sound adjusting processing should coincide with the frequency characteristic of the frequency characteristic adjusting processing. For example, when there is a peak or dip (peak or dip satisfying conditions, for example a half-value width should be a predetermined value or smaller and an absolute value of a peak (dip) level should be a predetermined value or larger) that is characteristic in the frequency characteristic of the indirect sound adjusting processing, the reverse characteristic of the frequency characteristic from which the characteristic peak or dip has been extracted may be set as the frequency characteristic of the frequency characteristic adjusting processing.

Here, the specifying unit 201 may calculate the frequency characteristic of the indirect sound adjusting processing by calculating a frequency characteristic for a circuit where the specified first parameter is set. Also, the specifying unit 201 may perform the calculation while assuming that a difference between the frequency characteristic of the estimated impulse response when the specified first parameter is set in the indirect sound adjusting unit 1021 and the frequency characteristic of the measured impulse response is attributed to the processing frequency characteristic of the indirect sound adjusting unit 1021. At this time, it may be possible to use an estimated impulse response that is obtained when all the amplification factors of the first parameter are set to be 'zero (0)', instead of the measured impulse response.

When the second parameter specifying processing in the specifying unit 201 is over, the setting unit 202 sets the parameters specified by the specifying unit 201 in the delay unit 113 and the level adjusting units 114-1, 114-2, . . . , **114-*n* of the indirect sound adjusting unit 1021 and sets the second parameter in the frequency characteristic adjusting unit 1022 (parameter setting processing, step S160). When this setting is over, the control unit 2** ends the parameter setting processing. The parameter setting method is as described above.

Subsequently, a difference of the impulse responses at the sound receiving point is exemplified when the correction processing is performed by using the correction processing unit 102 in which the parameters are set as described above and when the correction processing is not performed. In the below, the difference is described, depending on whether the indirect sound adjusting processing is performed or not and whether the frequency characteristic adjusting processing is performed or not.

[Comparison of Presence of Indirect Sound Adjusting Processing]

Figure 7A:
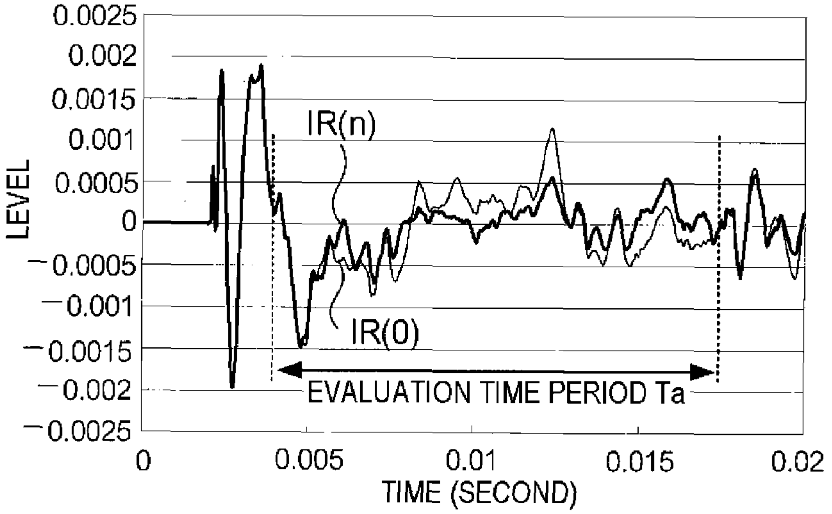
FIGS. 7A and 7B are graphs illustrating a difference of impulse responses, depending on the presence of indirect sound adjusting processing in the embodiment of the invention.
Figure 7B:
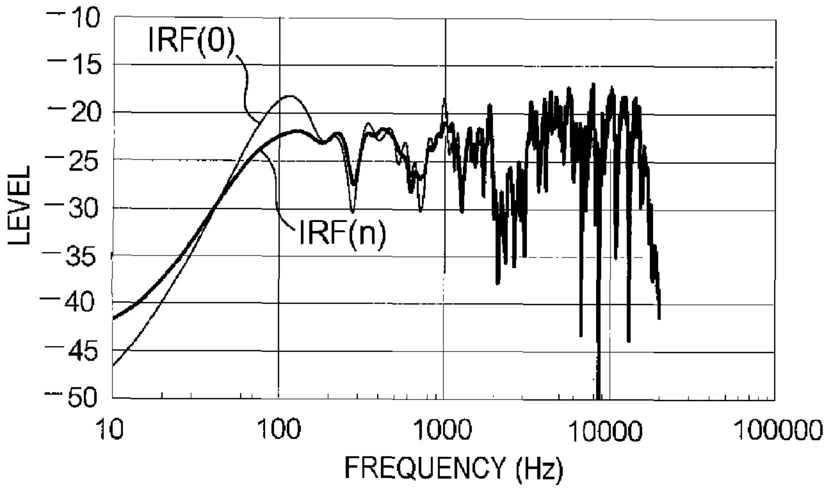

FIGS. 7A and 7B illustrate a difference of the impulse responses, depending on the presence of the indirect sound adjusting processing in the embodiment of the invention. In FIG. 7A, a horizontal axis indicates time in which '0' indicates time at which the measuring signal is output, and a vertical axis indicates a signal level. In FIG. 7B, a horizontal axis indicates a frequency and a vertical axis indicates a signal level. Here, the frequency characteristic adjusting processing has not been performed.

FIG. 7A compares an impulse response signal IR(0) when the indirect sound adjusting processing has not been performed with an impulse response signal IR(n) when the indirect sound adjusting processing has been performed for a case where the parameters have been set in the multi-tap delay having the n signal lines in the indirect sound adjusting unit 1021 according to the above-described parameter setting method. FIG. 7A shows signals of the impulse response signals IR(0) and IR(n), which are obtained by extracting only frequency bands of the cutoff frequency Fc (500 Hz) or lower set in the low-pass filter 112, so as to easily compare the impulse response signals.

Comparing the impulse response signals IR(0) and IR(n), as shown in FIG. 7A, it can be clearly seen that the impulse response signal IR(n) has the energy lower than the impulse response signal IR(0) in the evaluation time period Ta. In particular, the peaks are generally suppressed in the evaluation time period Ta. The listener hears the sound in which the influence of the indirect sound that reaches in the evaluation time period Ta, i.e., a time period shorter than the temporal resolution of the auditory sense has been reduced by the decrease in the energy. Therefore, the listener can hear the sound having the improved sound quality, compared to the case where the indirect sound adjusting processing has not been performed.

FIG. 7B shows the frequency characteristics of the impulse response signals IR(0) and IR(n) shown in FIG. 7A. The spectra indicating the frequency characteristics of the impulse response signals IR(0) and IR(n) are IRF(0) and IRF(n), respectively. As shown in FIGS. 7A and 7B, it can be seen that the energy is suppressed in the low frequency band passing to the low-pass filter 112 by the indirect sound adjusting processing. Particularly, the energy is largely suppressed in the vicinity of 100 Hz. Therefore, when the listener hears such sound, the listener may feel that there is something lacking in the low frequency band.

Figure 8:
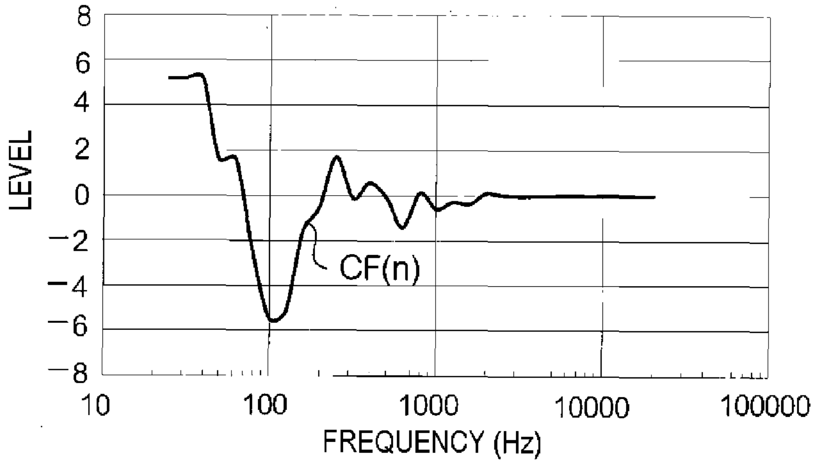
FIG. 8 is a graph illustrating a frequency characteristic of the indirect sound adjusting processing in the embodiment of the invention.

FIG. 8 illustrates a frequency characteristic of the indirect sound adjusting processing in the embodiment of the invention. In FIG. 8, a horizontal axis indicates a frequency and a vertical axis indicates a signal level. A spectrum indicating the frequency characteristic of the indirect sound adjusting processing is CF(n). The frequency characteristic CF(n) is calculated as the frequency characteristic of a circuit where the parameters have been set in the multi-tap delay having the n signal lines in the indirect sound adjusting unit 1021 according to the above-described parameter setting method. As shown in FIG. 7B, the energy around 100 Hz is largely suppressed by the indirect sound adjusting processing of this example. In correspondence to this, as shown in FIG. 8, the frequency characteristic of the indirect sound adjusting processing shows a characteristic that a dip largely lowering the level around 100 Hz is seen.

Figure 9A:
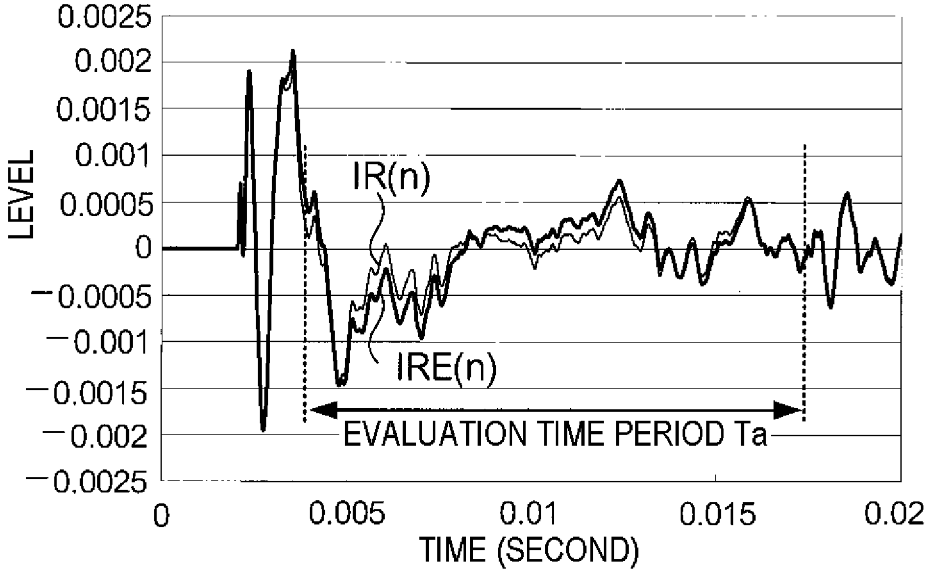
FIGS. 9A and 9B are graphs illustrating a difference of impulse responses, depending on the presence of frequency characteristic adjusting processing in the embodiment of the invention.
Figure 9B:
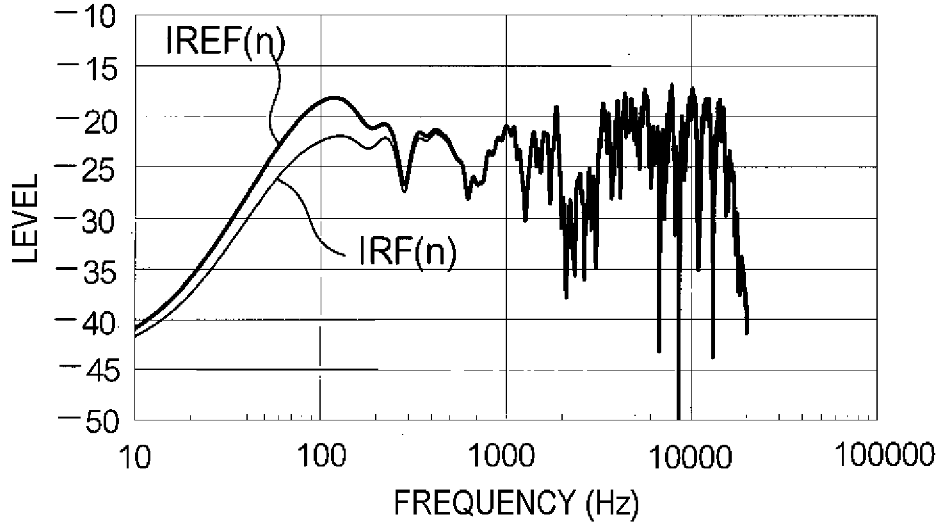

FIGS. 9A and 9B illustrate a difference of impulse responses, depending on the presence of frequency characteristic adjusting processing in the embodiment of the invention. In FIG. 9A, a horizontal axis indicates time in which '0' indicates time at which the measuring signal is output, and a vertical axis indicates a signal level. In FIG. 9B, a horizontal axis indicates a frequency and a vertical axis indicates a signal level. Here, the impulse responses are compared depending on the presence of the frequency characteristic adjusting processing has been performed, after the indirect sound adjusting processing shown in FIGS. 7A and 7B has been performed. The frequency characteristic adjusting processing is performed when the second parameter is set in the frequency characteristic adjusting unit 1022 as the reverse characteristic of the frequency characteristic shown in FIG. 8. In the frequency characteristic of the frequency characteristic adjusting processing of this example, the second parameter is determined so as to reflect the reverse characteristic (around 100 Hz) of the characteristic dip part, other than the reverse characteristic itself. In this example, the second parameter is set so that the central frequency is '100 Hz', the bandwidth is a specific width (which may be a predetermined specific width) that is determined depending on the half-value width of the dip part and the gain becomes a peak characteristic of '+5 dB.'

FIG. 9A compares an impulse response signal IR(n) when the indirect sound adjusting processing has been performed but the frequency characteristic adjusting processing has not been performed with an impulse response signal IRE(n) when the indirect sound adjusting processing and the frequency characteristic adjusting processing have been performed. FIG. 9A shows signals of the impulse response signals IR(n) and IRE(n), which are obtained by extracting only frequency bands of the cutoff frequency Fc (500 Hz) or lower set in the low-pass filter 112, so as to easily compare the impulse response signals.

Comparing the impulse response signals IR(n) and IRE (n), as shown in FIG. 9B, it can be seen that the impulse response signal IRE(n) has the energy higher than the impulse response signal IR(n). However, the peak appearing in the impulse response IR(0) shown in FIG. 7A is not generated.

FIG. 9B shows the frequency characteristics of the impulse response signals IR(n) and IRE(n) shown in FIG. 9A. The spectra indicating the frequency characteristics of the impulse response signals IR(n) and IRE(n) are IRF(n) and IREF(n), respectively. As shown in FIGS. 9A and 9B, by the frequency characteristic adjusting processing, the energy around 100 Hz is increased and the deficiency that the listener feels is reduced.

Figure 10A:
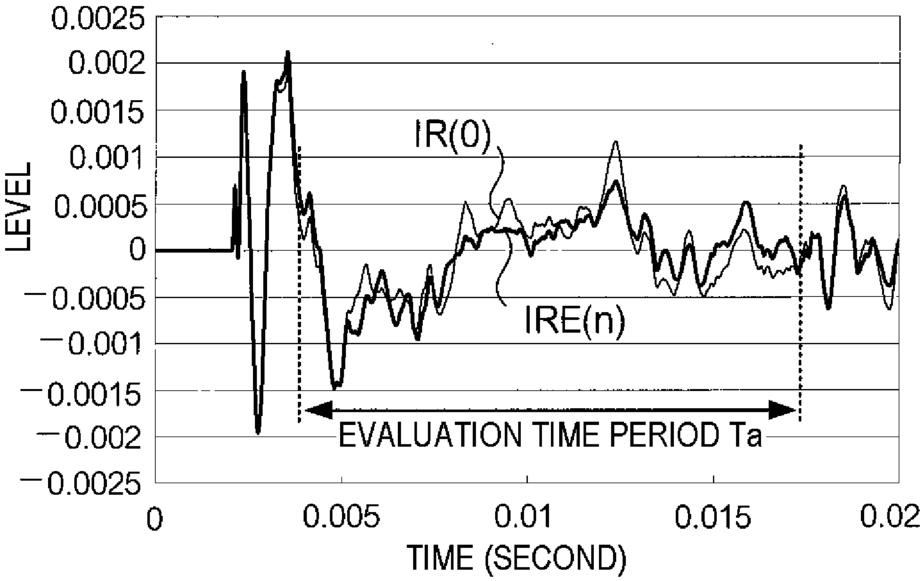
FIGS. 10A and 10B are graphs illustrating a difference of impulse responses, depending on the presence of correction processing in the embodiment of the invention.
Figure 10B:
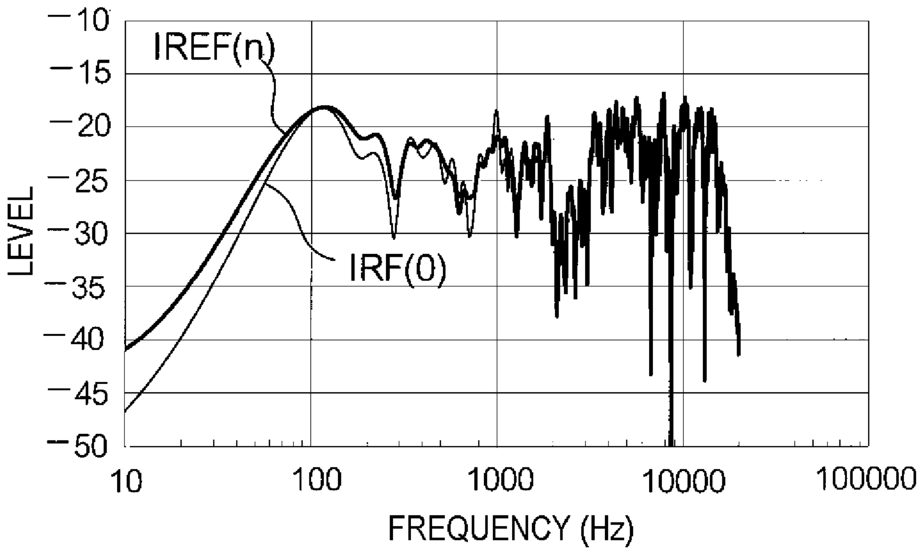

FIGS. 10A and 10B illustrate a difference of impulse responses, depending on the presence of the correction processing in the embodiment of the invention. FIG. 10A compares the impulse response IR(0) shown in FIG. 7A with the impulse response IRE(n) shown in FIG. 9A, and FIG. 10B compares the impulse response IRF(0) shown in FIG. 7B with the impulse response IREF(n) shown in FIG. 9B. As shown in FIG. 10A, the peak appearing in the impulse response IR(0) is suppressed in the impulse response IRE(n) by the correction processing. Also, as shown in FIGS. 7B, 9B and 10B, the second parameter is determined so that the impulse response IREF(n) is more approximate to the impulse response IRF(0) than the impulse response IRF(n), and the impulse responses IREF(n) and IRF(0) have the substantially same spectrum, respectively. Therefore, it is possible to reduce the deficiency that the listener feels while suppressing the influence of the indirect sound to be exerted on the sound quality by the correction processing.

Like this, the speaker apparatus 1 performs the correction processing for the input audio signal Sin and then outputs the same as the sound. Thereby, the listener located at the sound receiving point hears the sound with the influence of the indirect sound being reduced in the evaluation time period Ta. In particular, the influence of the indirect sound is reduced in the low frequency band passing through the low-pass filter 112. In this case, since the frequency characteristic of the audio signal is less changed before and after the correction processing, the energy is not suppressed in a specific frequency band, so that the listener does not feel the deficiency well.

Furthermore, the cutoff frequency Fc that is set in the low-pass filter 112 is set as a frequency so that a wavelength thereof becomes a length several times longer than a size of a person's head. Therefore, the influence of the indirect sound is reduced in a range of the wavelength about the sound receiving point. When the correction processing is performed by using the audio signal that does not pass through the low-pass filter 112, the correction processing is made even for the sound in a high frequency band having a short wavelength. Thus, when the position of the listener (sound receiving point) is moved beyond the range of the wavelength, the correction effect in the high frequency band is reduced and the adverse effect may be exerted on the sound quality.

In this case, the correction processing is performed by using the audio signal having passed through the low-pass filter 112. Thereby, even when the position of the listener is a little changed, the effect of reducing the influence of the indirect sound is not lost immediately. Also, when the indirect sound that the listener hears is in the low frequency band, the listener is apt to feel the influence thereof that is exerted on the sound quality. Therefore, even when there is no effect of reducing the influence of the indirect sound in the high frequency band, it is possible to effectively reduce the influence of the indirect sound that is exerted on the sound quality, by reducing the influence of the indirect sound in the low frequency band.

MODIFIED EXAMPLES

Although the embodiment of the invention has been described, the invention can be implemented in various examples, as described below.

Modified Example 1

In the above embodiment, the specifying unit 201 specifies the first parameter so that the energy of the impulse response signal IR(n) in the evaluation time period Ta when the indirect sound adjusting processing is performed is smaller than the energy of the impulse response signal IR(0) in the evaluation time period Ta when the indirect sound adjusting processing is not performed, thereby reducing the influence of the indirect sound. Alternatively, the first parameter may be specified in other ways.

In a first way, the specifying unit 201 may specify the first parameter so that a peak value of an absolute value of the impulse response signal IR(n) in the evaluation time period Ta is smaller than a peak value of an absolute value of the impulse response signal IR(0) in the evaluation time period Ta, thereby reducing reduce the influence of the indirect sound.

In this case, when specifying the first parameter for each of the signal lines, the specifying unit 201 compares the respective signals, which indicate the plurality of estimated impulse responses calculated in correspondence to the first parameter (delay time, amplification factor) having a plurality of different values, and selects an estimated impulse response having the smallest maximum value of the peak values of the absolute values in the evaluation time period Ta.

In a second way, the specifying unit 201 may specify the first parameter so that a variation in the frequency characteristic of the impulse response signal IR(n) is smaller than a variation in the frequency characteristic of the impulse response signal IR(0), thereby reducing reduce the influence of the indirect sound.

In this case, when specifying the first parameter for each of the signal lines, the specifying unit 201 compares the respective signals, which indicate the plurality of estimated impulse responses calculated in correspondence to the first parameter (delay time, amplification factor) having a plurality of different values, and selects an estimated impulse response having the smallest variation in the frequency characteristic.

Also, in the above ways, the estimated impulse response is selected so that the energy, the peak value and the variation in the frequency characteristic become smaller. Alternatively, the estimated impulse response may be selected so that the energy, the peak value and the variation in the frequency characteristic become larger or approximate to a constant value. In this case, although the influence of the indirect sound is not reduced, the estimated impulse response may be used for reproducing a special sound field and the like. At this time, since the energy in a specific frequency band may be increased by the indirect sound adjusting processing, the second parameter may be determined so that the energy in the specific frequency band is decreased in the frequency characteristic adjusting processing. Like this, it is sufficient if configured to have a relation between the frequency characteristic of the indirect sound adjusting processing and the frequency characteristic of the frequency characteristic adjusting processing.

Second Modified Example

In the above embodiment, the specifying unit 201 calculates the plurality of estimated impulse responses for each signal line and compares the same with the measured impulse response to specify the first parameter, thereby sequentially specifying the first parameter for all the signal lines. Alternatively, the specifying unit 201 may specify the first parameter every a plurality of signal lines.

A case is described in which the specifying unit 201 specifies the first parameter every three signal lines. The three signal lines are m, m+1 and m+2. On the assumption that a condition of dm<dm+1<dm+2 is satisfied with respect to the first parameter (where delay times are expressed by dm, dm+1, dm+2, and amplification factors are suppressed by g, gm+1, gm+2) corresponding to the signal lines, the specifying unit 201 calculates a plurality of estimated impulse responses when the corresponding values are variously changed and thus temporarily set.

Then, the specifying unit 201 compares the signals indicating the plurality of estimated impulse responses and selects an estimated impulse response having the smallest energy in the evaluation time period Ta. Then, the specifying unit 201 specifies a value corresponding to the selected estimated impulse response, as the first parameter (delay time: dm, dm+1, dm+2; and amplification factor: g, gm+1, gm+2).

Subsequently, the specifying unit 201 specifies the parameter for the m+3th, m+4th and m+5th signal lines by the same method as the above. By continuing the processing, the specifying unit 201 specifies the first parameter that should be set in correspondence to the nth signal line.

In this way, the specifying unit 201 specifies the first parameter for a unit of a plurality of signal lines and thus makes the energy of the impulse response signal IR(n) smaller in the evaluation time period Ta, compared to the case where the specifying unit 201 specifies the first parameter for each single signal line. Also, the larger the number of the signal lines, which becomes a unit when specifying the first parameter, the energy can be further reduced. However, a processing time for calculating the estimated impulse responses is increased. Therefore, the specifying unit 201 preferably integrates all the n signal lines and specifies the first parameter when there is an allowance for processing time. For example, even while the speaker apparatus 1 outputs the sound for which the correction processing has been performed, the specifying unit 201 may perform the processing in the background.

Third Modified Example

In the above embodiment, when the specifying unit 201 specifies the first parameter in correspondence to the one signal line, the specifying unit 201 specifies the first parameter corresponding to a next signal line and ends the processing when the first parameter is also specified for the nth signal line. Alternatively, the specifying unit 201 may end the processing even though it does not reach the nth signal line when a predetermined condition is satisfied.

In this case, for example, when a difference between the signal energy of the estimated impulse response selected when specifying the first parameter for a pth signal line and the signal energy of the estimated impulse response selected when specifying the first parameter for a p+1th signal line does not reach a preset threshold, the specifying unit 201 ends the processing without specifying the first parameter for a p+2th (<n) signal line. Then, the specifying unit 201 inactivates the signal lines after p+2th (or p+1th) so that they are not used in the correction processing.

By doing so, it is possible to reduce the processing time of the calculation of the specifying unit 201, which is performed when specifying the first parameter.

Fourth Modified Example

In the above embodiment, the low-pass filter 112 is provided on the signal path prior to the delay unit 113.

Alternatively, the low-pass filter 112 may be provided on the signal line after the delay unit 113 owing to the cascade connection of the linear invariant system. That is, the low-pass filter 112 may be provided on the signal line before the audio signal, which has been processed in the delay unit 113 and the level adjusting units 114-1, 114-2, . . . , **114-*n*, is added to the original audio signal, which is input to the indirect sound adjusting unit 1021, in the adding unit 115**.

In this case, a second adding unit that first adds the audio signal output from the level adjusting units 114-1, 114-2, . . . , **114-*n* may be provided and the audio signal output from the second adding unit may be processed in the low-pass filter 112 and then output to the adding unit 115**.

Also, the low-pass filter 112 is not necessarily required. That is, in an environment in which the position of the listener is little changed, the effect of reducing the influence of the indirect sound is not lost well even when the low-pass filter 112 is not provided.

Fifth Modified Example

In the above embodiment, the input level adjusting unit 111 is fixed with the preset amplification factor. Alternatively, the amplification factor may be changed after the first parameter specifying processing. Thus, since the frequency characteristic of the indirect sound adjusting processing is varied, when the amplification factor is varied after the second parameter specifying processing, the content of the second parameter may be updated as the amplification factor is varied.

Sixth Modified Example

In the indirect sound adjusting unit 1021, the influence of the indirect sound that is exerted on the sound quality is adjusted by using the input level adjusting unit 111, the low-pass filter 112, the delay unit 113 and the level adjusting units 114-1, 114-2, . . . , **114-*n*. However, the other configuration may be also used. For example, the signal processing in a part or all of the configurations may be implemented with a digital filter such as FIR filter. In this case, the first parameter that is determined to adjust the influence of the indirect sound exerted on the sound quality corresponds to a coefficient of the FIR filter. Then, the indirect sound adjusting unit 1021 adds the audio signal for which the signal processing has been performed by the FIR filter to the audio signal for which the signal processing has not been performed and outputs the same. Like this, the indirect sound adjusting unit 1021** may have any configuration insomuch as it has a configuration of performing the signal processing, which is determined to adjust the influence of the indirect sound exerted on the sound quality, for an audio signal, adding the audio signal to an audio signal for which the signal processing has not been performed and outputting the same.

Seventh Modified Example

In the above embodiment, the sound processing apparatus (an apparatus having at least the control unit 2 and the sound processing unit 10) in the embodiment is applied to the speaker apparatus 1. However, the invention is not limited to the speaker apparatus 1. For example, the sound processing apparatus can be also applied to an AV (Audio Visual) amplifier, an AV receiver and the like to which the speaker unit 213 and the microphone 221 are connected as the external apparatuses. Also, the sound processing apparatus can be applied to a television, a personal computer (PC), a gaming machine and the like.

Eighth Modified Example

A control program of the above embodiment can be provided as stored in a computer-readable recording medium such as magnetic recording medium (magnetic tape, magnetic disk and the like), optical recording medium (optical disk and the like), magneto optical disk, semiconductor memory and the like. Also, the speaker apparatus 1 may download the control program via the network.

Ninth Modified Example

In the above embodiment, the signal processing unit 101 acquires the audio signal Sin input to the interface 5. If the sound processing apparatus 1 has a capability of generating an audio signal, however, the signal processing unit 101 may acquires the audio signal which is generated in the sound processing apparatus 1 instead of acquiring the audio signal Sin input to the interface 5.

What is claimed is:

1. A sound processing apparatus, comprising:

a processing unit including an indirect sound adjuster and a frequency characteristic adjuster, the processing unit being configured to acquire an audio signal, to perform a correction processing on the acquired audio signal and to output the correction-processed audio signal to a sound emitting unit, the correction processing on the acquired audio signal including an indirect sound adjusting processing, by the indirect sound adjuster, to adjust an influence of an indirect sound to be heard at a sound receiving point among a sound emitted by the sound emitting unit, and a frequency characteristic adjusting processing, by the frequency characteristic adjuster, in which a frequency characteristic is adjusted to suppress a change caused by the indirect sound adjusting processing, wherein a frequency characteristic for the frequency characteristic adjusting processing is such that a frequency characteristic of a first impulse response at the sound receiving point in a case where both the indirect sound adjusting processing and the frequency characteristic adjusting processing are performed comes closer to a frequency characteristic of a second impulse response at the sound receiving point in a case where neither the indirect sound adjusting processing nor the frequency characteristic adjusting processing is performed, as compared with a frequency characteristic of a third impulse response at the sound receiving point in a case where the indirect sound adjusting processing is performed but the frequency characteristic adjusting processing is not performed.

2. The sound processing apparatus according to claim 1, wherein the given signal processing performed in the indirect sound adjusting processing is implemented using a multi-tap delay.

3. The sound processing apparatus according to claim 2, wherein a maximum delay time in the multi-tap delay is set to be 50 milliseconds or less.

4. The sound processing apparatus according to claim 1, wherein the indirect sound adjuster is configured to perform the indirect sound adjusting processing before the frequency characteristic adjuster performs the frequency characteristic adjusting processing.

5. The sound processing apparatus according to claim 1, wherein the frequency characteristic adjuster is configured to perform the frequency characteristic adjusting processing before the indirect sound adjuster performs the indirect sound adjusting processing.

* * * * *